(12) United States Patent
Dirsa et al.

(10) Patent No.: US 11,857,030 B2
(45) Date of Patent: Jan. 2, 2024

(54) CUSTOMIZED ARTICLE TYPE

(71) Applicant: NIKE, Inc., Beaverton, OR (US)

(72) Inventors: David J. Dirsa, North Andover, MA (US); Clifford B. Gerber, Hillsboro, OR (US); Petre Gheorghian, Portland, OR (US); E. Scott Morris, Beaverton, OR (US)

(73) Assignee: NIKE, Inc., Beaverton, OR (US)

( * ) Notice: Subject to any disclaimer, the term of this patent is extended or adjusted under 35 U.S.C. 154(b) by 0 days.

(21) Appl. No.: 17/156,134

(22) Filed: Jan. 22, 2021

(65) Prior Publication Data

US 2021/0137220 A1    May 13, 2021

Related U.S. Application Data

(63) Continuation of application No. 16/829,741, filed on Mar. 25, 2020, now Pat. No. 10,905,201, which is a
(Continued)

(51) Int. Cl.
| | | |
|---|---|---|
| G06F 30/00 | (2020.01) | |
| A43D 119/00 | (2006.01) | |
| A43B 3/00 | (2022.01) | |
| G06Q 50/04 | (2012.01) | |
| G06Q 10/087 | (2023.01) | |
| G06Q 30/0601 | (2023.01) | |
| G05B 15/02 | (2006.01) | |

(52) U.S. Cl.
CPC .......... *A43D 119/00* (2013.01); *A43B 3/0078* (2013.01); *G05B 15/02* (2013.01); *G06F 30/00* (2020.01); *G06Q 10/087* (2013.01); *G06Q 30/0601* (2013.01); *G06Q 50/04* (2013.01); *A43D 2200/60* (2013.01); *Y02P 90/30* (2015.11)

(58) Field of Classification Search
CPC ....... G06F 30/00; G05B 15/02; A43D 119/00; A43D 2200/60; G06Q 30/0601; A43B 3/0078
See application file for complete search history.

(56) References Cited

U.S. PATENT DOCUMENTS

| | | |
|---|---|---|
| 5,128,880 A | 7/1992 | White |
| 5,195,030 A | 3/1993 | White |

(Continued)

FOREIGN PATENT DOCUMENTS

| | | |
|---|---|---|
| CN | 104520920 A | 4/2015 |
| WO | 2013090055 A2 | 6/2013 |
| WO | 2013090057 A2 | 6/2013 |

OTHER PUBLICATIONS

Mar. 30, 2015—(EP) ESR—App. No. 12823062.0.
(Continued)

*Primary Examiner* — Andrea C Leggett
(74) *Attorney, Agent, or Firm* — Banner & Witcoff, Ltd.

(57) ABSTRACT

A method of making an article of footwear is disclosed. The method may include the steps of selecting a family of article types, selecting a customized article type, manufacturing an article of footwear with the customized article type and shipping the article of footwear to a pre-designated shipping address. The customized article type can be configured with a user selected characteristic. The method can also include limiting the number of article types displayed to a user at any time.

20 Claims, 12 Drawing Sheets

Related U.S. Application Data continuation of application No. 15/948,138, filed on Apr. 9, 2018, now Pat. No. 10,617,178, which is a continuation of application No. 14/609,622, filed on Jan. 30, 2015, now Pat. No. 9,949,534, which is a continuation of application No. 13/327,312, filed on Dec. 15, 2011, now Pat. No. 9,009,614.

(56) References Cited

U.S. PATENT DOCUMENTS

| | | |
|---|---|---|
| 5,216,594 A | 6/1993 | White et al. |
| 5,237,520 A | 8/1993 | White |
| 5,339,252 A | 8/1994 | White et al. |
| 6,366,281 B1 | 4/2002 | Lipton et al. |
| 6,411,338 B1 | 6/2002 | Neill |
| 7,216,092 B1 | 5/2007 | Weber et al. |
| 7,467,349 B1 | 12/2008 | Bryar et al. |
| 7,945,343 B2 | 5/2011 | Jones et al. |
| 8,214,766 B1 | 7/2012 | Berger et al. |
| 8,418,068 B1 | 4/2013 | Backus et al. |
| 9,009,614 B2 | 4/2015 | Dirsa et al. |
| 9,070,160 B2 | 6/2015 | Dirsa et al. |
| 9,569,746 B2 | 2/2017 | Potter et al. |
| 9,949,534 B2 | 4/2018 | Dirsa et al. |
| 10,617,178 B2 | 4/2020 | Dirsa et al. |
| 10,905,201 B2 | 2/2021 | Dirsa et al. |
| 2002/0085046 A1 | 7/2002 | Furuta et al. |
| 2002/0103714 A1 | 8/2002 | Eze |
| 2003/0110095 A1 | 6/2003 | Danenberg |
| 2005/0071935 A1 | 4/2005 | Shah et al. |
| 2005/0090928 A1 | 4/2005 | Gibson |
| 2005/0143174 A1 | 6/2005 | Goldman et al. |
| 2005/0177453 A1 | 8/2005 | Anton et al. |
| 2005/0286799 A1 | 12/2005 | Huang et al. |
| 2006/0001682 A1 | 1/2006 | Honda |
| 2006/0052892 A1 | 3/2006 | Matsushima et al. |
| 2006/0070260 A1* | 4/2006 | Cavanagh ............... G16H 50/50 36/44 |
| 2007/0043630 A1 | 2/2007 | Lyden |
| 2007/0208633 A1 | 9/2007 | Singh |
| 2007/0282666 A1 | 12/2007 | Afeyan et al. |
| 2008/0010867 A1 | 1/2008 | Davis |
| 2008/0126981 A1 | 5/2008 | Candrian et al. |
| 2008/0147219 A1 | 6/2008 | Jones et al. |
| 2008/0189194 A1* | 8/2008 | Bentvelzen ........ G06Q 30/0633 705/26.7 |
| 2008/0220850 A1 | 9/2008 | Pacey |
| 2009/0249177 A1 | 10/2009 | Yamaji et al. |
| 2010/0005686 A1 | 1/2010 | Baum |
| 2010/0010893 A1 | 1/2010 | Rajaraman et al. |
| 2010/0036753 A1* | 2/2010 | Harvill ................... G06Q 50/04 705/26.1 |
| 2010/0121739 A1 | 5/2010 | McCarthy |
| 2010/0180469 A1 | 7/2010 | Baucom et al. |
| 2010/0236105 A1 | 9/2010 | Almaguer |
| 2010/0287515 A1 | 11/2010 | Hedman et al. |
| 2010/0289971 A1 | 11/2010 | Odland et al. |
| 2010/0299616 A1* | 11/2010 | Chen ................. G06Q 30/0601 715/753 |
| 2010/0318442 A1 | 12/2010 | Paul et al. |
| 2011/0050886 A1 | 3/2011 | Thompson et al. |
| 2011/0083341 A1 | 4/2011 | Baum |
| 2011/0099845 A1 | 5/2011 | Miller |
| 2011/0172797 A1 | 7/2011 | Jones et al. |
| 2011/0183739 A1 | 7/2011 | Ansari et al. |
| 2011/0184725 A1 | 7/2011 | Connor |
| 2011/0191204 A1 | 8/2011 | Litke et al. |
| 2011/0192049 A1 | 8/2011 | Auger et al. |
| 2011/0261071 A1 | 10/2011 | Ganetakos et al. |
| 2012/0144330 A1 | 6/2012 | Flint |
| 2013/0041617 A1 | 2/2013 | Pease et al. |
| 2013/0110666 A1 | 5/2013 | Aubrey |
| 2013/0155111 A1 | 6/2013 | Dirsa et al. |
| 2013/0159866 A1 | 6/2013 | Dirsa et al. |
| 2015/0196098 A1 | 7/2015 | Dirsa et al. |
| 2016/0287937 A1* | 10/2016 | Fitzgerald ............ A61B 5/1122 |

OTHER PUBLICATIONS

U.S. Appl. No. 61/440,243, filed Feb. 7, 2011—Fitzgerald Priority Application (c), Provisional Parent of US20160287937A1.
U.S. Appl. No. 62/130,494, filed Mar. 9, 2015—Fitzgerald Priority Application (b), Provisional Parent of US20160287937A1.

* cited by examiner

CUSTOMIZED ARTICLE TYPE

CROSS-REFERENCE TO RELATED APPLICATIONS

This present application is a continuation of U.S. application Ser. No. 16/829,741, filed Mar. 25, 2020, which is a continuation of U.S. application Ser. No. 15/948,138, filed Apr. 9, 2018, now U.S. Pat. No. 10,617,178, which is a continuation of U.S. application Ser. No. 14/609,622, filed Jan. 30, 2015, now U.S. Pat. No. 9,949,534, which is a continuation of U.S. application Ser. No. 13/327,312, filed Dec. 15, 2011, now U.S. Pat. No. 9,009,614. The content of the above noted applications is hereby incorporated by reference in its entirety for any and all non-limiting purposes.

BACKGROUND

The present invention relates generally to footwear, and in particular the present invention relates to a method of making an article of footwear.

Articles of footwear may generally comprise an upper and a sole. The sole may include an outsole, a midsole and/or an insole. The upper may be used to secure the sole to the foot.

SUMMARY

In one aspect, a method of customization for an article of footwear includes receiving a selected family of article types and providing a set of article types according to the family of article types. Each article type in the set of article types has a different height. Providing the set of article types includes sending information related to the set of article types to a program running on a computing system. The information related to the set of article types is configured for use in visibly representing the set of article types within the program. The method further includes receiving a user selected article type from the set of article types and manufacturing the article of footwear corresponding to the user selected article type, the article of footwear having a height corresponding with the user selected article type.

In another aspect, a method of customization for an article of footwear includes receiving a selected family of article types. The method further includes providing a set of article types according to the family of article types, where each article type in the set of article types has a different upper mesh spacing size and where providing the set of article types includes sending information related to the set of article types to a program running on a computing system. The information related to the set of article types is configured for use in visibly representing the set of article types within the program. The method also includes receiving a user selected article type from the set of article types and manufacturing the article of footwear corresponding to the user selected article type. The article of footwear has an upper mesh spacing size corresponding with the user selected article type.

In another aspect, a method of customization for an article of footwear includes providing a set of article types, where providing the set of article types includes sending information related to the set of article types to a program running on a computing system. The information related to the set of article types is configured for use in visibly representing the set of article types within the program. The method also includes receiving a user selected article type from the set of article types and providing a group of variable article characteristics for the user selected article type, where each variable article characteristic in the group of variable article characteristics has a range of values. At least one of the variable article characteristics in the group of variable article characteristics is a sole density for a sole of the article of footwear. The method further includes receiving information related to a user selected article characteristic for at least one variable article characteristic in the group of variable article characteristics and manufacturing the article of footwear corresponding to the user selected article type. The article of footwear has the user selected article characteristic.

In another aspect, a method of customization for an article of footwear includes providing a set of article types, where providing the set of article types includes sending information related to the set of article types to a program running on a computing system. The information related to the set of article types is configured for use in visibly representing the set of article types within the program. The method further includes receiving a user selected article type from the set of article types and providing a group of variable article characteristics for the user selected article type, where each variable article characteristic in the group of variable article characteristics has a range of values. At least one of the variable article characteristics in the group of variable article characteristics is a height for a sole of the article of footwear. The method also includes receiving information related to a user selected article characteristic for at least one variable article characteristic in group of variable article characteristics and manufacturing the article of footwear corresponding to the user selected article type, the article of footwear having the user selected article characteristic.

In another aspect, a method of customization for an article of footwear includes providing information related to a first family of article types and a second family of article types, the second family of article types being different from the first family of article types. The method also includes receiving a selected family of article types corresponding to the first family of article types. The method further includes retrieving a maximum number of article types to be displayed and selecting a constrained number of article types of be displayed that is less than the maximum number of article types to be displayed. The method also includes providing a set of article types according to the selected family of article types, where each article type in the set of article types has a different physical characteristic, and where the number of article types in the set of article types is equal to the constrained number of articles types. Providing the set of article types includes sending information related to the set of article types to a program running on a computing system, where the information related to the set of article types is configured for use in visibly representing the set of article types within the program. The method also includes receiving a user selected article type from the set of article types and manufacturing the article of footwear corresponding to the user selected article type.

Other systems, methods, features and advantages of the embodiments will be, or will become, apparent to one with skill in the art upon examination of the following figures and detailed description. It is intended that all such additional systems, methods, features and advantages be included within this description, be within the scope of the embodiments, and be protected by the following claims.

BRIEF DESCRIPTION OF THE DRAWINGS

The embodiments can be better understood with reference to the following drawings and description. The components in the figures are not necessarily to scale, emphasis instead being placed upon illustrating the principles of the embodiments. Moreover, in the figures, like reference numerals designate corresponding parts throughout the different views.

DETAILED DESCRIPTION OF THE EMBODIMENTS

Figure 1:
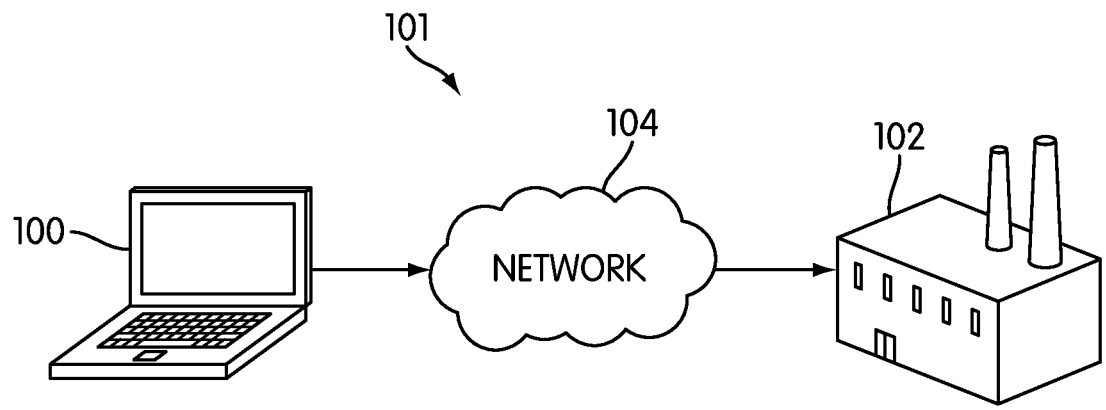
FIG. 1 is a schematic view of an illustrative embodiment of a customization system.

FIG. 1 is a schematic diagram of an illustrative embodiment of customization system 101. The term "customization system", as used throughout this detailed description, refers to a system for manufacturing articles of footwear that include a customized design of some kind. In some embodiments, the article may be customized by the manufacturer or a third party designer. In one embodiment, the article may be customized by the party purchasing the articles of footwear.

In one embodiment, customization system 101 comprises remote terminal 100 connected to vendor 102 by way of network 104. Generally, remote terminal 100 may be any type of computer, including either a desktop or a laptop computer. In other embodiments, remote terminal 100 may be any type of device that includes a display, a processor, and an ability to transmit and receive data from a remote network. Examples of such devices include, but are not limited to, PDA's, cell phones, as well as other types of devices.

In this embodiment, vendor 102 represents a manufacturing system configured to manufacture articles of footwear. Here, vendor 102 is shown as a single building for illustrative purposes only. In many cases, vendor 102 will comprise many buildings. In some cases, vendor 102 may comprise many buildings that are disposed in different geographic locations. Generally, the term "vendor", as used here, may also refer to distributors and/or suppliers. In other words, the term "vendor" may also apply to various operations on the manufacturing side, including the operations responsible for parts, labor, and/or retail of the article of footwear, as well as other manufacturing side operations.

In one embodiment, network 104 is configured to relay information between remote terminal 100 and vendor 102. Generally, network 104 may be a system allowing for the exchange of information between remote terminal 100 and vendor 102. Examples of such networks include, but are not limited to, personal area networks, local area networks, wide area networks, client-server networks, peer-to-peer networks, as well as other types of networks. Additionally, network 104 may support wired transmissions, wireless transmissions, or both wired and wireless transmissions. In some embodiments, network 104 may be a packet-switched communications system. In one embodiment, network 104 may be the Internet.

In this embodiment, customization system 101 may include provisions that allow a customer to select a customized article type for a pair of footwear that will be produced by a vendor. The term "article type", as used throughout this detailed description, refers to a classification of an article of footwear based on the general structure and physical aspects of the article of footwear. In other words, the term "article type" may include characterizations of articles of footwear including, but not limited to, running shoes, basketball shoes, soccer shoes, athletic shoes with cleats, hiking shoes, loafers, boots, sandals, work shoes, dance shoes, and orthopedic shoes.

Figure 2:
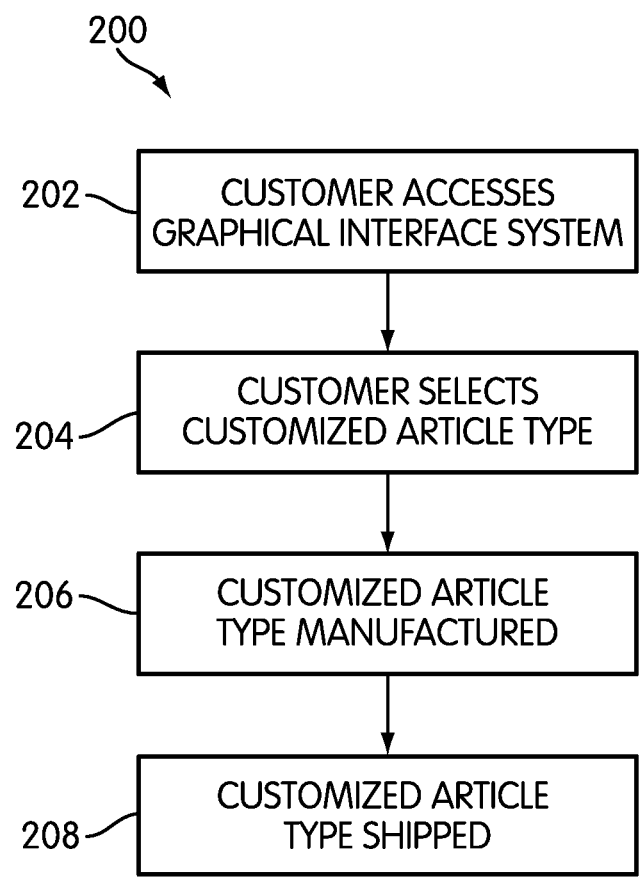
FIG. 2 is an embodiment of a process for a customization system.

Referring to FIG. 2, process 200 is an embodiment of a process of how customization system 101 may proceed. During first step 202, a customer may access a graphical interface system in order to select a customized article type. Once the customer has accessed the graphical interface system, the customer may select a customized article type during second step 204. Following this, the customized article type may be manufactured according to the customer's selection during third step 206. Finally, during fourth step 208, the customized article type of footwear may be shipped to the customer.

Figure 3:
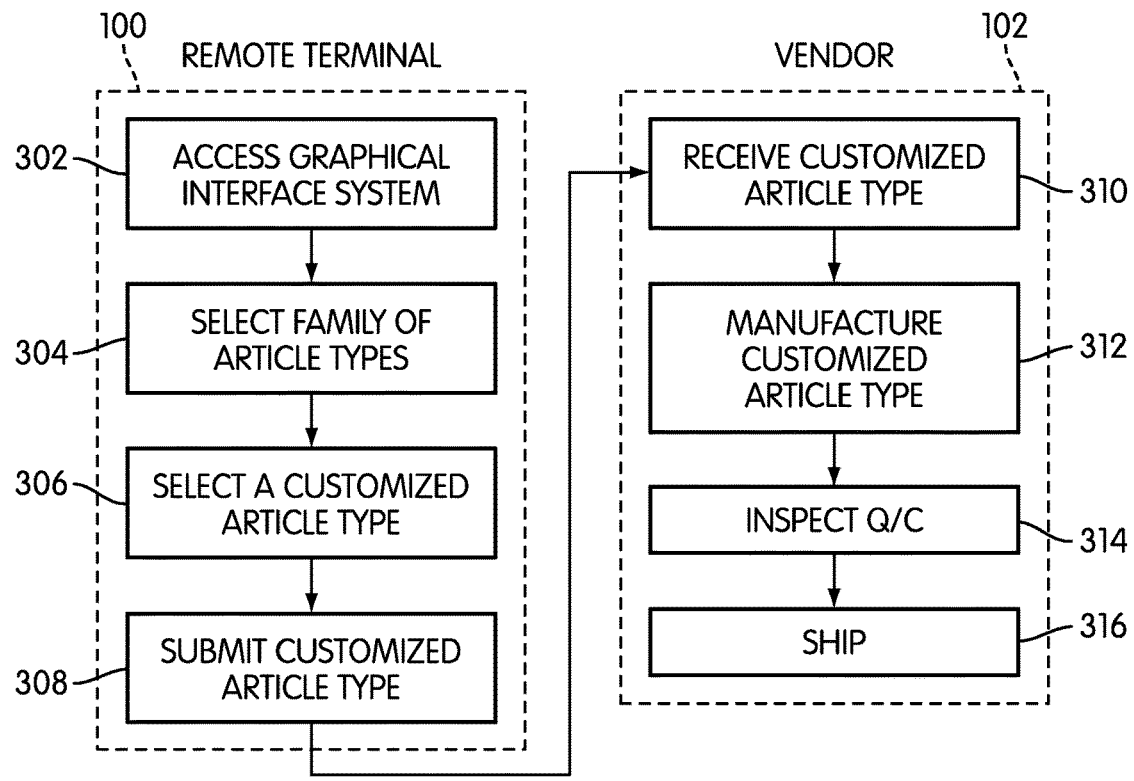
FIG. 3 is an embodiment of a detailed process for a customization system.

Referring to FIG. 3, customization system 101 may be best understood by separating the steps associated with remote terminal 100 and those associated with vendor 102. In some cases, those steps associated with remote terminal 100 are performed on or by remote terminal 100 and those steps associated with vendor 102 are performed on or by vendor 102. However, this is not necessarily the case, and some of the steps associated with remote terminal 100 may be performed on or by vendor 102 or some other resource, and some of the steps associated with vendor 102 may be performed on or by remote terminal 100 or some other resource.

In first step 302, a customer may access a graphical interface system with remote terminal 100. In some cases, the customer may access the graphical interface system through a website. Here, the term "website" is used in the most general sense as meaning any collection of data located on a remote server accessible with a web browser of some kind. In many cases, a website may be a collection of web pages found on the World Wide Web. In one embodiment, the term "web page" may refer to any HTML/XHTML document.

In one embodiment, vendor 102 includes a server of some type that supports a website with a graphical interface system. This graphical interface system may be used to design a customized article type. In some embodiments, the graphical interface system may be a graphical editor of some kind. In one embodiment, the graphical interface system may provide a set of tools that allow the customer to easily select a customized article type for an article of footwear.

In an alternative embodiment, a website supporting a graphical interface system may be hosted outside of vendor 102. In other words, the website may be owned and run by a third party separate from vendor 102. Generally, the process of selecting a customized article type for an article of footwear may proceed as before. In this case, the finalized customized article type information will be processed and sent to vendor 102 by the third party.

Although a graphical interface system may be accessed via a website through the Internet in one embodiment, in other embodiments, the graphical interface system could be accessed in other ways. For example, in some embodiments, the graphical interface system could be run directly on a remote terminal. In other words, the graphical interface system could be a program that can be installed on a remote terminal. In some cases, the graphical interface system could be installed on a personal computer of a customer. In other cases, the graphical interface system could be installed on a remote terminal located at a retail store or kiosk. In these cases, the graphical interface system may still communicate with one or more vendors through a network, such as the Internet, in order to provide customer ordering information for the customized product. Additionally, in some cases, the remote terminal could print order forms that could then be sent to one or more vendors by a courier or a postal service.

Once the customer has accessed the graphical interface system, the customer may select a family of article types in second step 304. The term "family of article types", as used throughout this specification and in the claims, refers to a group of article types sharing substantially similar features. In one embodiment, article types may be grouped in families based on similar features including both color and/or design. For example, articles colored black and silver could be grouped into one family, while articles colors blue and gold could be grouped into another family. In another embodiment, article types may be grouped in families based on similar technological features. For example, articles sharing a common technology to provide shock absorption could be grouped in one family, while articles sharing a common technology to provide increased cushioning to a portion of a sole could be grouped into another family.

It should be understood that a family of article types may include a spectrum of article types. For example, a family of article types with a common design feature may contain article types such as a running shoe as well as a hiking boot. In addition, a family of article types can also include different features as well as substantially similar features.

It may also be possible for an article type to have membership in multiple families. For example, an article type may be a member of a first family based on technological features of the article type and a member of a second family based on color.

Following the selection of a family of article types, the customer may select a customized article type in third step 306. During fourth step 308, the finalized customized article type may be submitted to vendor 102. In some embodiments, the submission may be transferred through the Internet.

In fifth step 310, vendor 102 may receive and reviews the customized article type. During sixth step 312, vendor 102 manufactures a pair of footwear with the customized article type. Following sixth step 312, vendor 102 may execute quality control procedures and inspects the pair of footwear with the customized article type during seventh step 314. Finally, in eighth step 316, vendor 102 ships the pair of footwear with the customized article type to a pre-designated shipping address.

The following description discusses the details of the steps outlined and briefly described with reference to FIG. 3. In some cases, a customer has access to a remote terminal. Using the remote terminal, the customer may gain access to a website supplied by a vendor or a third party. In some embodiments, the website may include a graphical interface system, as discussed briefly in first step 302.

The process of creating a customized type of footwear may begin with a customer selecting one or more article types. In some embodiments, a customer may select one or more article types from a list of pre-selected article types. In some cases, this list can be provided by a vendor. In other embodiments, a customer may select two or more article types from a list of pre-selected article types. In one embodiment, a customer may select a family of article types.

Figure 4:
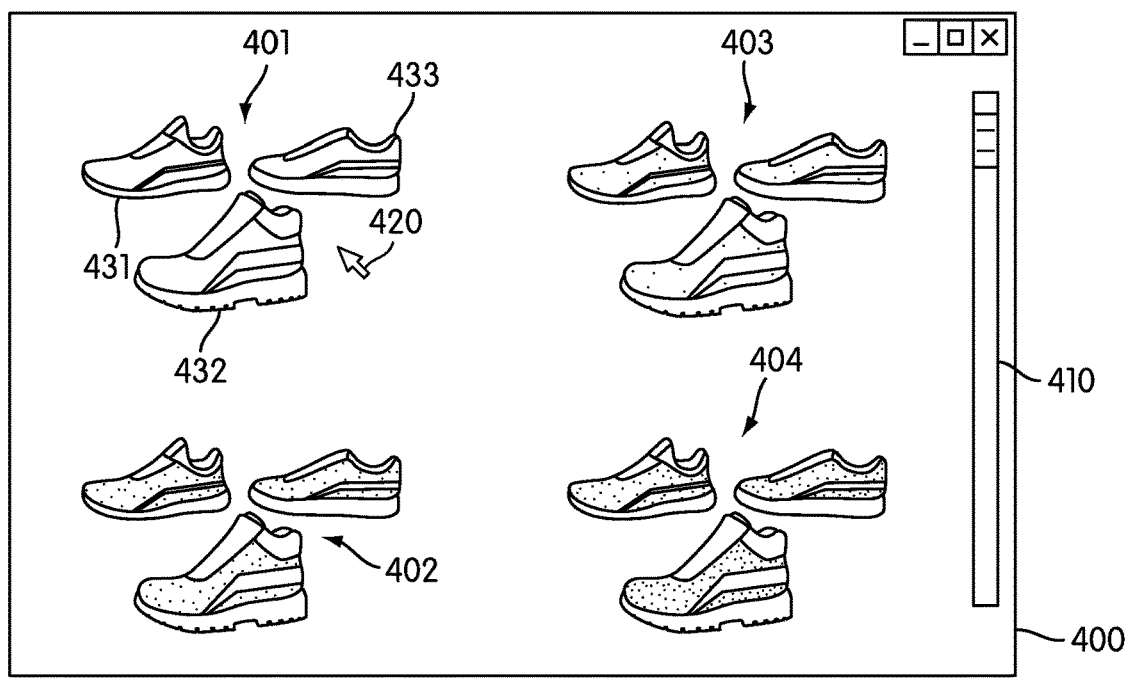
FIG. 4 is an embodiment of a graphical interface system with article types representing families of articles of footwear.

FIG. 4 is an embodiment of graphical interface system 400 that displays four families of articles of footwear. In particular, graphical interface system 400 displays first family 401, second family 402, third family 403 and fourth family 404. In other embodiments, graphical interface system 400 may display more or less families of articles of footwear. In some cases, graphical interface system 400 may provide scroll bar 410 to allow a customer to view additional families of footwear. In other cases, graphical interface system 400 may include other provisions to allow a customer to view additional families of footwear.

In one embodiment, each family of footwear is associated with a plurality of article types. In some embodiments, each family of footwear may include two pre-selected article types. In other embodiments, each family of footwear may include three pre-selected article types. In still other embodiments, each family of footwear may include four or more pre-selected article types. In this embodiment, each family is associated with three pre-selected article types.

For the sake of clarity, the graphical images of the article types will be referred to as article types, but it should be understood that the article types displayed by graphical interface system 400 are in fact graphical representations of actual articles of footwear. Additionally, throughout this specification, it should be understood that not only a single article of footwear, but a pair of footwear may be designed with customization system 101. Any customized article types, as well as designs, tools, or other mechanisms applied to the design of one article of footwear, may likewise be applied to a second, complementary, article of footwear. The term "complementary", as used throughout this specification and in the claims, refers to the association of a left article of footwear with a right article of footwear and vice-versa.

In one embodiment, the three article types associated with first family 401, second family 402, third family 403 and fourth family 404 share common features. In this embodiment, the article types comprising first family 401 may include a common design such as substantially similar trim designs. Although first family 401 includes article types with a common design, first family 401 is also comprised of multiple article types. In particular, first family 401 is represented by first article type 431, second article type 432, and third article type 433. In some cases, first article type 431 may be a walking shoe, second article type may be a running shoe and third article type 433 may be a hiking boot.

In a similar manner, second family 402 may comprise article types with a black and gold color scheme. Likewise, third family 403 may include article types employing a particular technological feature. Finally, fourth family 404 may include article types colored pink. In other embodiments, first family 401, second family 402, third family 403 and fourth family 404 may be grouped based on other common features.

In one embodiment, graphical interface system 400 allows a customer to select a family of article types to create a customized article type. Generally, graphical interface system 400 may be configured in any manner to allow a customer to select a family of article types. In this embodiment, graphical interface system 400 includes selection tool 420. Selection tool 420 is represented by a cursor configured as an arrow. In other cases, selection tool 420 may include a different graphical representation. With selection tool 420, graphical interface system 400 allows a customer to select a family of article types. In this embodiment, a customer selects first family 401 with selection tool 420.

Following the selection of a family of article types, graphical interface system 400 may be configured to allow a customer to create a customized article type based on the selected family. In some embodiments, a customer may select one or more article types from a list of pre-selected article types within the selected family. In one embodiment, a customer may create a customized article type by first viewing two representative article types of the selected family of article types. In some cases, the two representative article types of the family may be the two representatives that are the most dissimilar. For example, two representative article types of a family of article types with a common design feature may be a first article type of a running shoe with a low-top upper comprised of a wide spaced mesh material and light-weight sole and a second article type of a hiking boot with a high-top upper comprised of leather and a heavy-weight sole. With this arrangement, graphical interface system 400 is configured to allow a customer to create a customized article type that may be an intermediate type of the representative article types of the selected family.

Figure 5:
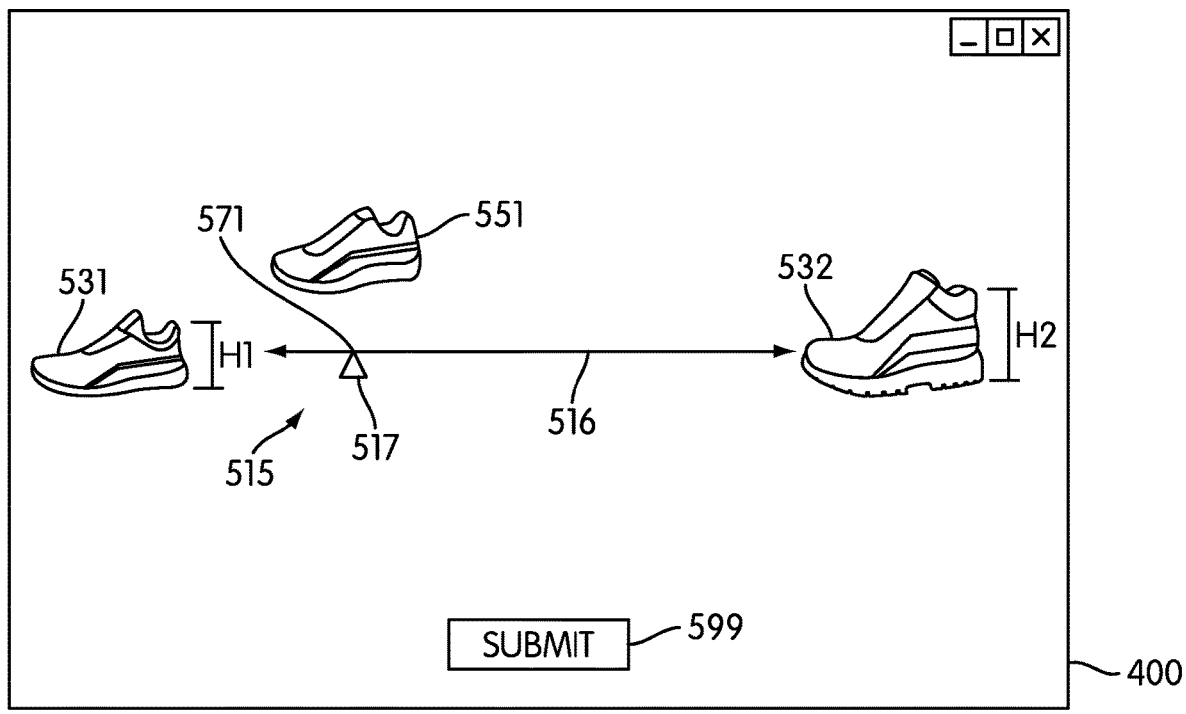
FIG. 5 is an embodiment of a graphical interface system with customized article types.

FIG. 5 is an embodiment of graphical interface system 400 following the selection of first family 401 in FIG. 4. In this embodiment, graphical interface system 400 displays two representative article types of first family 401. In particular, graphical interface system 400 displays first representative article type 531 and second representative article type 532 as representative article types of first family 401.

In one embodiment, first representative article type 531 and second representative article type 532 are two different article types. In this embodiment, first representative article type 531 is a running shoe. In one embodiment, first representative article type 531 includes a light-weight sole and a low-top upper with height H1. In contrast, second representative article type 532 is a hiking boot. In one embodiment, second representative article type 532 includes a thick sole with treads and a high-top upper with height H2. In one embodiment, height H2 is greater than height H1. Using this arrangement, first representative article type 531 and second representative article type 532 may provide dissimilar article types in order to allow a customer to create a customized article type that may be an intermediate type between first representative article type 531 and second representative article type 532.

Generally, graphical interface system 400 may be configured in various ways to allow a customer to create a customized article type that is an intermediate type between first representative article type 531 and second representative article type 532. In some embodiments, graphical interface system 400 may accept a user selected value from a customer in order to create a customized article type that may be intermediate between first representative article type 531 and second representative article type 532. In an embodiment, graphical interface system 400 may include a slider that may be manipulated by a customer to indicate a customized article type that may be an intermediate type between first representative article type 531 and second representative article type 532.

In this embodiment, graphical interface system 400 includes slider 515. Furthermore, slider 515 includes track 516 and indicator 517. In some cases, track 516 may be disposed horizontally between first representative article type 531 and second representative article type 532. In other cases, track 516 may be disposed in another location within graphical interface system 400. With this arrangement, indicator 517 may be moved on track 516 to indicate a customized article type intermediate between first representative article type 531 and second representative article type 532.

In the current embodiment, a customer may move indicator 517 on track 516 to a position that may be associated with a customized article type. In other words, a customer may move indicator 517 closer to first representative article type 531 than second representative article type 532 to create a customized article type more similar to first representative article type 531 than second representative article type 532. Likewise, a customer may move indicator 517 closer to second representative article type 532 than first representative article type 531 to create a customized article type more similar to second representative article type 532. Using this arrangement, a customer may manipulate slider 515 to create a customized article type.

In some cases, positions on track 516 may be associated with customized article types. In the current embodiment, indicator 517 is disposed in first position 571 on track 516 that is associated with first customized article type 551. In order to assist a customer in creating a customized article type, first customized article type 551 may be displayed in any location within graphical interface system 400 when indicator 517 is disposed in first position 571 on track 516. In this embodiment, first customized article type 551 is disposed above indicator 517. Since indicator 517 is closer to first representative article type 531, first customized article type 551 may be more similar to first representative article type 531 than second representative article type 532.

Figure 6:
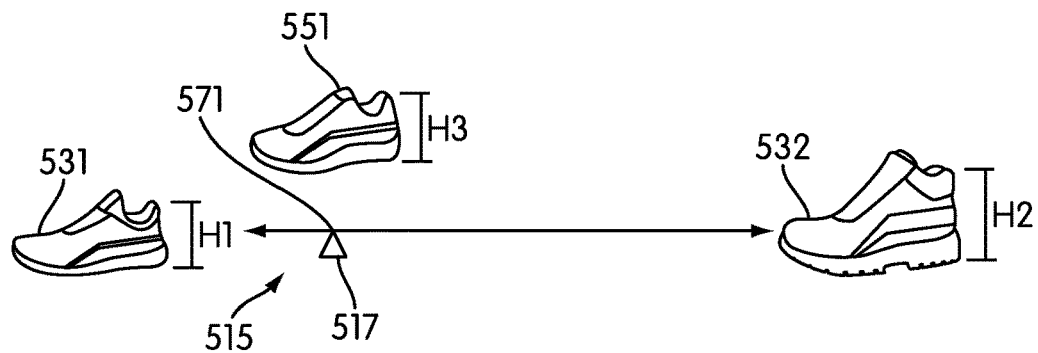
FIG. 6 is a schematic view of an embodiment of a customized article type associated with a position on a graphical slider that may be manipulated by a customer.
Figure 7:
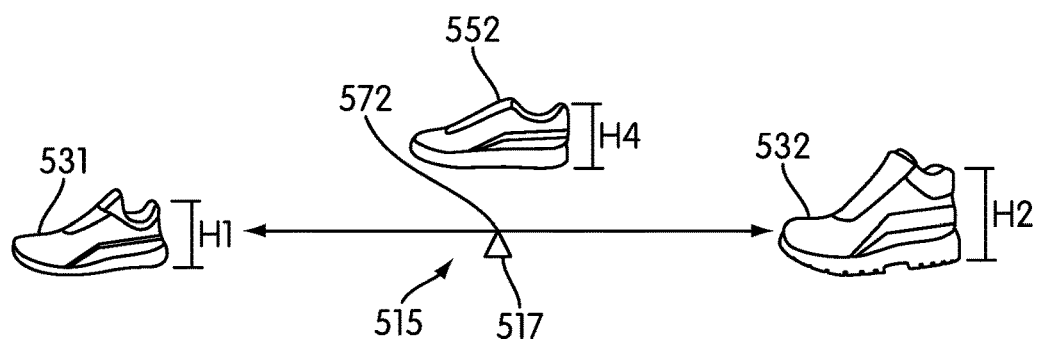
FIG. 7 is a schematic view of an embodiment of a customized article type associated with a position on a graphical slider that may be manipulated by a customer.
Figure 8:
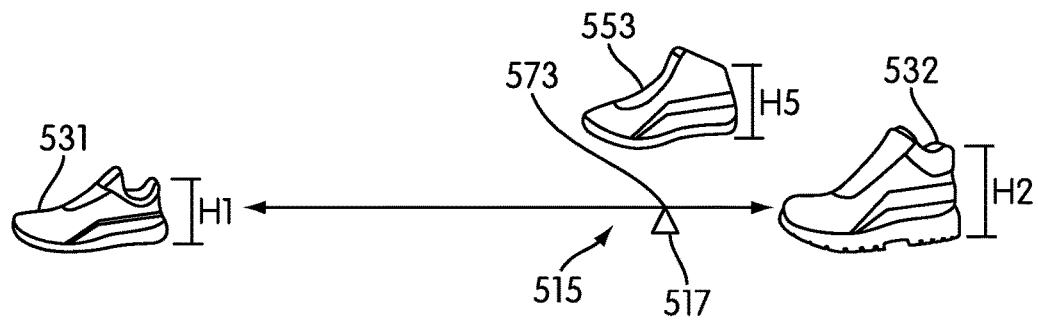
FIG. 8 is a schematic view of an embodiment of a customized article type associated with a position on a graphical slider that may be manipulated by a customer.

FIGS. 6-8 illustrate exemplary embodiments of customized article types that may be associated with different positions of indicator 517. The customized article types illustrated in these embodiments are intended to be exemplary. In addition, aspects of customized article types may be different with various positions of indicator 517, although changes may not be obvious in these exemplary embodiments. In other embodiments, positions of indicator 517 may be associated with different customized article types.

As previously discussed, first position 571 may be associated with first customized article type 551. Referring to FIG. 6, first customized article type 551 is configured with height H3. In this embodiment, height H3 is greater than height H1 of first representative article type 531. Similarly, height H3 is less than height H2 of second representative article type 532. In other words, height H3 has a value between height H1 and height H2. Furthermore, in this embodiment, since first position 571 is closer to first representative article type 531 than second representative article type 532, height H3 is closer to height H1 than height H2.

In some cases, as indicator 517 is moved to a position closer to second representative article type 532, a customized article type may be created that closely resembles second representative article type 532. Referring to FIG. 7, indicator 517 is in second position 572 that is closer than first position 571 to second representative article type 532. In this embodiment, second position 572 may be associated with second customized article type 552. Second customized article type 552 is configured with height H4. In some cases, height H4 of second customized article type 552 is greater than height H3 of first customized article type 551, since second position 572 is closer than first position 571 to second representative article type 532 with height H2.

Referring to FIG. 8, indicator 517 is in third position 573 that is closer than second position 572 to second representative article type 532. With this configuration, third position 573 may be associated with a customized article type that is more similar to second representative article type 532 than second customized article type 552 of the previous embodiment. In this embodiment, third position 573 is associated with third customized article type 553 with height H5. Furthermore, height H5 is greater than height H4 of second customized article type 552. With this arrangement, a customer may generate a customized article type with a specific height by selecting a position on slider 515. In addition, this configuration provides a means of fine tuning the process of creating a customized article type.

It should be understood that the article types of first representative article type 531 and second representative article type 532 differ in additional properties other than height. For the sake of clarity, the discussion regarding FIGS. 6-8 considers the heights of customized article types. However, customized article types associated with different positions on track 516 will differ with respect to other properties as well. The following embodiments illustrate multiple differences between article types.

It is also possible that graphical interface system 400 may be configured in another manner to allow a customer to create a customized article type based on a selected family of article types. In some embodiments, graphical interface system 400 may generate a pre-determined set of customized article types based on the selected family. With this arrangement, a customer may choose a customized article type from a pre-determined set of customized article types.

Figure 9:
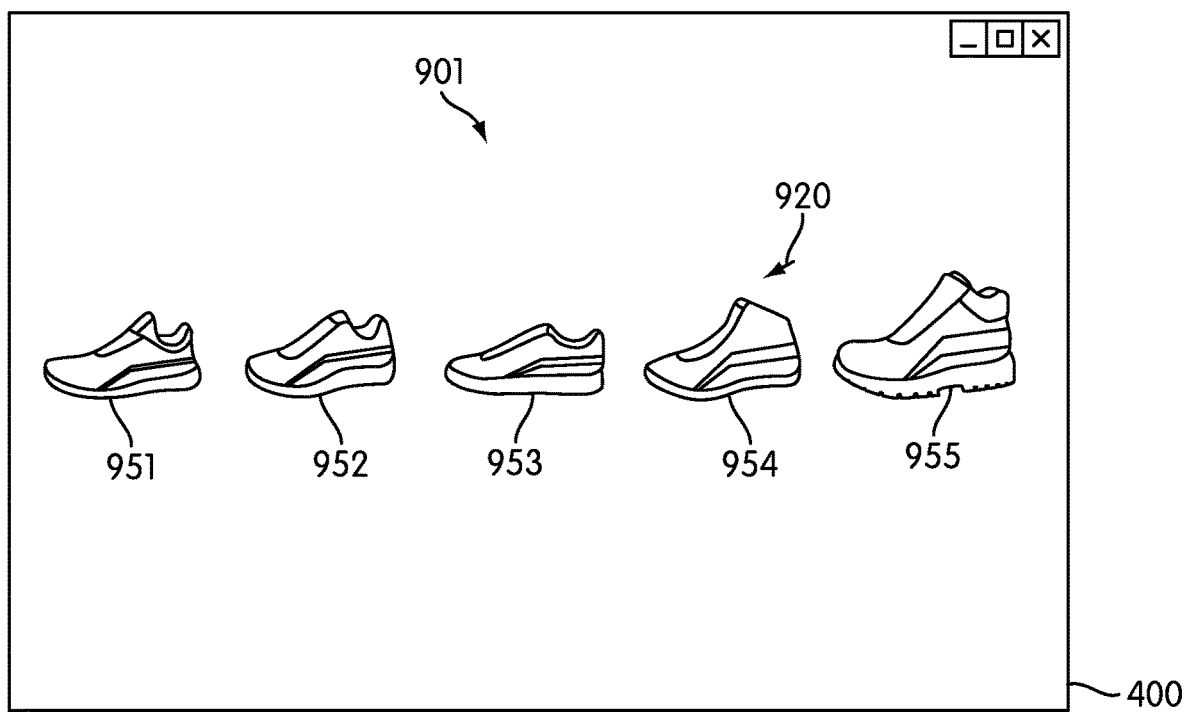
FIG. 9 is an alternative embodiment of a graphical interface system with a set of a customized article types.
Figure 10:
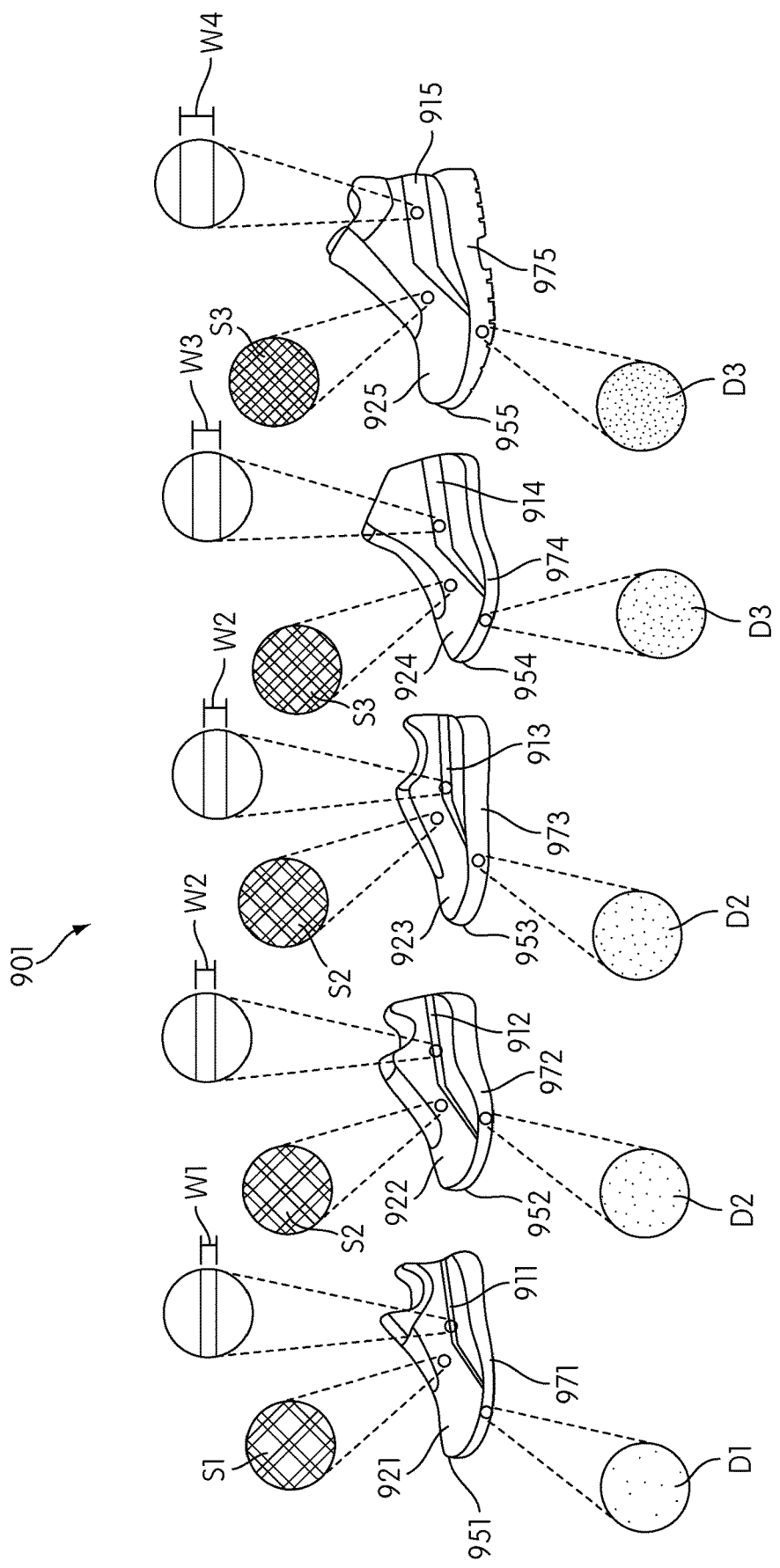
FIG. 10 is an enlarged view of an exemplary embodiment of a customized article set.

FIGS. 9-10 illustrate an alternative embodiment of a process for creating a customized article type following the selection of a family of article types. Following the selection of first family 401 in FIG. 4, graphical interface system 400 displays a pre-determined set of article types based on first family 401. In this embodiment, graphical interface system 400 displays first customized article type set 901.

Generally, first customized article type set 901 may contain any number of customized article types. In some cases, the number of customized article types within a customized article type set may vary depending on the selected family of article types. In other words, some families of article types may contain a greater number of customized article types than other families of article types. In this embodiment, first customized article type set 901 includes five article types. In particular, first customized article type set 901 comprises first customized article type 951, second customized article type 952, third customized article type 953, fourth customized article type 954 and fifth customized article type 955.

Graphical interface system 400 may display first customized article type set 901 in any manner that may aid a customer in creating a customized article type. In some embodiments, first customized article type set 901 may be displayed by graphical interface system 400 so that article types proximate to each other may be more similar than article types not disposed proximately. In this manner, first customized article type set 901 may be displayed as a spectrum of customized article types. In some cases, this arrangement of first customized article type set 901 may assist a customer in selecting a customized article type.

In order to distinguish the greatest differences in customized article types within the selected family, first customized article type 951 and fifth customized article type 955 may be disposed the furthest distance from each other by graphical interface system 400. Similar to the previous embodiment, first customized article type 951 and fifth customized article type 955 may be representative article types representing the selected family of article types. In this embodiment, first customized article type 951 may be a running shoe with a low-top upper comprised of a wide spaced mesh material and light-weight sole. In contrast, fifth customized article type 955 may be a hiking boot with a high-top upper comprised of a tough exterior and a heavy-weight sole.

With first customized article type set 901 displayed as a spectrum of article types, second customized article type 952, third customized article type 953, and fourth customized article type 954 may be displayed between first customized article type 951 and fifth customized article type 955 as intermediate customized article types. Specifically, second customized article type 952 may be displayed proximate to first customized article type 951 to indicate a similarity between second customized article type 952 and first customized article type 951. In a similar manner, fourth customized article type 954 may be displayed proximate to fifth customized article type 955 indicating a similarity to fifth customized article type 955. Finally, third customized article type 953 may be arranged between second customized article type 952 and fourth customized article type 954 to show that third customized article type 953 is most similar to second customized article type 952 and fourth customized article type 954. In some cases, this arrangement assists a customer in creating a customized article type.

As described above, the customization process may include presenting a user with a set of article types from which the user may select a desired article type. For example, as shown in FIG. 9, a user is presented with five possible article types from which the user can select a desired customized article type. In general, the number of customized article types presented to a user could vary in different embodiments.

Some embodiments can include provisions for controlling the number of customized article types presented to a user during the customization process. For example, some embodiments may be configured so that the number of customized article types presented to a user is always equal to or greater than a predetermined minimum number. In some cases, the minimum number could be 1. In still other cases, the minimum number could be 2. In still other cases, the minimum number could be 3. In still other cases, the minimum number could be 4 or greater than 4. This arrangement may enhance the user experience by ensuring that the user is given enough options for choosing a customized article type.

Some embodiments could include a maximum number of customized article types that can be presented to, or otherwise provided for, a user. In other words, some embodiments may be configured so that the number of customized article types that may be presented to a user is always less than or equal to the maximum number. In some cases, the maximum number could be 1. In other cases, the maximum number could be 2. In still other cases, the maximum number could be any number greater than 2. In still other cases, the maximum number could be 6. In still other cases, the maximum number could be 8. In still other cases, the maximum number could be 10. In still other cases, the maximum number could be 12. This arrangement may enhance the user experience by ensuring the user is not overwhelmed with too many options when selecting a customized article type.

It is also to be understood that some embodiments could control the number of options to be displayed to a user for any other customizable feature where the user may be presented with multiple options. In particular, this method for controlling the number of options displayed for a user is not limited to use with customized article types. As discussed in further detail below, various different elements, components and/or characteristics of an article type can also be customized. Examples of such customizable features include, but are not limited to: trim elements, toe caps, heel counters, sole materials, upper materials, component colors, various kinds of graphical elements as well as any other customizable elements, components or characteristics of an article type. Therefore, whenever a user is presented with a number of options for selecting a customizable component or characteristic, the number of options displayed to the user could be constrained with a minimum value and/or maximum value. Moreover, the minimum value and/or the maximum value could vary according to the feature being customized.

FIG. 10 illustrates an enlarged view of an exemplary embodiment of first customized article type set 901. This embodiment is intended to be exemplary. In other embodiments, first customized article type set 901 may include customized article types with additional and/or different properties. For the sake of clarity, only some changing properties of customized article types of first customized article type set 901 will be discussed in this detailed description. In particular, some portions of the customized article types of first customized article type set 901 are enlarged in FIG. 10 to provide greater detail of particular properties associated with first customized article type set 901. However, it should be understood that additional properties of customized article types within first customized article type set 901 could also differ.

As previously discussed, a family of article types may share a substantially similar feature. In this embodiment, article types of first customized article type set 901 may include a substantially similar feature of a trim design. Specifically, the article types of first customized article type set 901 include a design of trim that wraps around a heel with ends disposed near a sole. In this embodiment, first customized article type 951, second customized article type 952, third customized article type 953, fourth customized article type 954, and fifth customized article type 955 include first trim design 911, second trim design 912, third trim design 913, fourth trim design 914, and fifth trim design 915, respectively.

In some embodiments, a substantially similar feature common in a family of article types may vary in members of the family of article types. In this embodiment, the width of trim designs differ within article types of first customized article type set 901. Specifically, first trim design 911 includes width W1. In a similar manner, second trim design 912 has a width W2 that is greater than width W1 Likewise, third trim design 913 of third customized article type 953 includes width W2. With this arrangement, second trim design 912 and third trim design 913 both have a trim design of width W2. In contrast, fourth customized article type 954 includes fourth trim design 914 with width W3. Width W3 is greater than width W2 of second trim design 912 and third trim design 913. Finally, fifth customized article type 955 includes fifth trim design 915 with width W4. Width W4 is greater than width W3 and all other widths of trim designs of article types of first customized article type set 901. The differences in width of the trim design provide variation with the common feature of trim design for customized article types within first customized article type set 901.

In some cases, customized article types within first customized article type set 901 will vary with respect to other properties. Generally, customized article types within first customized article type set 901 will vary with respect to multiple properties. For example, in some cases, color schemes of customized article types within first customized article type set 901 may vary. It is also possible that different materials may be associated with a sole, midsole and/or upper of customized article types of first customized article type set 901.

In this exemplary embodiment, uppers associated with customized article types of first customized article type set 901 may be constructed of a mesh fabric. Furthermore, the mesh fabric may be configured with different amounts of spacing between threads in some customized article types of first customized article type set 901. With this arrangement, some customized article types may be configured with a more breathable mesh upper with greater spacing between threads, while other customized article types may be configured with less spacing between threads to provide a tougher and more rigid upper.

In this embodiment, first upper 921 of first customized article type 951 may be associated with a mesh with spacing S1 between threads. Spacing S1 is relatively large and provides first upper 921 with a degree of breathability. Similarly, second customized article type 952 and third customized article type 953 may include second upper 922 and third upper 923, respectively. Second upper 922 and third upper 923 are constructed of a mesh with spacing S2 between threads. Spacing S2 is smaller than spacing S1. Accordingly, this provides a greater stiffness for second upper 922 and third upper 923. Finally, fourth customized article type 954 and fifth customized article type 955 may be associated with fourth upper 924 and fifth upper 925, respectively. Fourth upper 924 and fifth upper 925 have a mesh with spacing S3 between threads. Spacing S3 is smaller than spacing S2. In some cases, spacing S3 between threads provides fourth customized article type 954 and fifth customized article type 955 with tougher and more protective fourth upper 924 and fifth upper 925, respectively. Using this configuration, a customer has the opportunity to create a customized article type by selecting from a variety of uppers configured with adjustments in the spacing of the threads of the mesh.

In a similar manner, customized article types within first customized article type set 901 may be associated with soles exhibiting different features. In some embodiments, customized article types within first customized article type set 901 may include soles constructed from different materials. In some cases, a first subset of first customized article type set 901 may include soles comprised of a polymer, while a second subset of first customized article type set 901 may include soles comprised of rubber to form a durable sole. In this exemplary embodiment, customized article types of first customized article type set 901 include soles constructed from the same material configured with different densities.

In this embodiment, first customized article type 951 includes first sole 971 with density D1. In some cases, density D1 is a relatively low density that provides flexibility and a low weight to first sole 971. Similarly, second customized article type 952 and third customized article type 953 include second sole 972 and third sole 973, respectively. Furthermore, second sole 972 and third sole 973 are configured with density D2 that is denser than density D1. With this arrangement, second sole 972 and third sole 973 may be more rigid than first sole 971 as well as a heavier weight. Finally, fourth customized article type 954 and fifth customized article type 955 may be associated with fourth sole 974 and fifth sole 975, respectively. Fourth sole 974 and fifth sole 975 are constructed with density D3. In some cases, density D3 is denser than density D2. This configuration imparts greater weight, rigidity and hardiness to fourth sole 974 and fifth sole 975. By choosing between customized article types with fine adjustments in the densities of the soles, a customer may create a customized article type.

In some embodiments, once a customer has selected a customized article type, the customer may continue customizing the customized article type using graphical interface system 400. In some cases, the customer could customize colors, add designs or otherwise further customize the customized article type. In some cases, graphical interface system 400 can include additional tools for adding additional customized designs. A method for modifying articles in this manner is disclosed by David P. Jones et al. in U.S. patent application Ser. No. 11/612,320, filed Dec. 18, 2006 and entitled "Method of Making an Article of Footwear", the entirety of which is hereby incorporated by reference.

A customization system can include provisions for independently selecting various article characteristics. In other words, a customization system can include provisions for allowing a user to choose characteristics or properties such as sole density, upper mesh density and toe cap size in an independent manner. Such properties or characteristics may be referred to as article characteristics, which correspond to characteristics of a particular component. Moreover, once selected by a user, the resulting article characteristic may be referred to as a user selected article characteristic.

Figure 11:
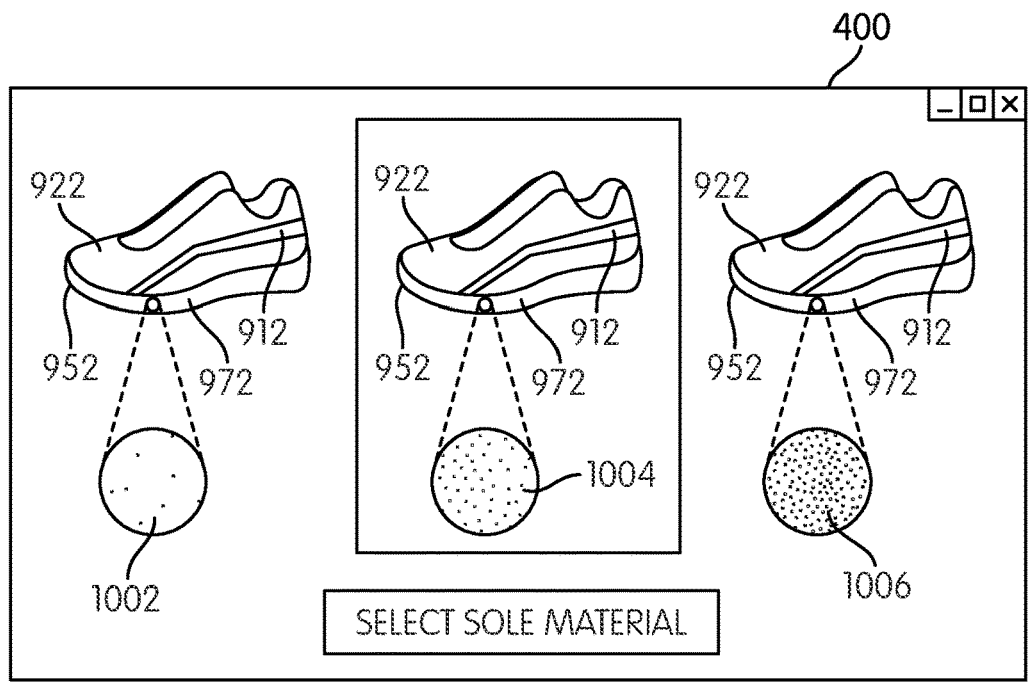
FIG. 11 is a schematic view of an embodiment where a user can select a sole material for an article type.
Figure 12:
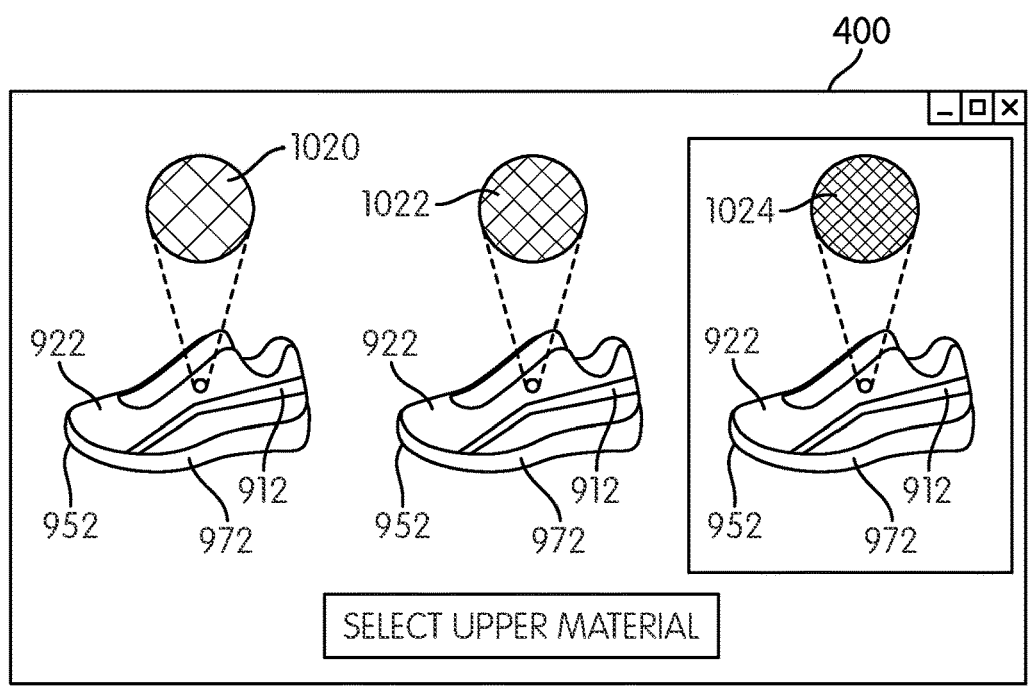
FIG. 12 is a schematic view of an embodiment where a user can select an upper material for an article type.
Figure 13:
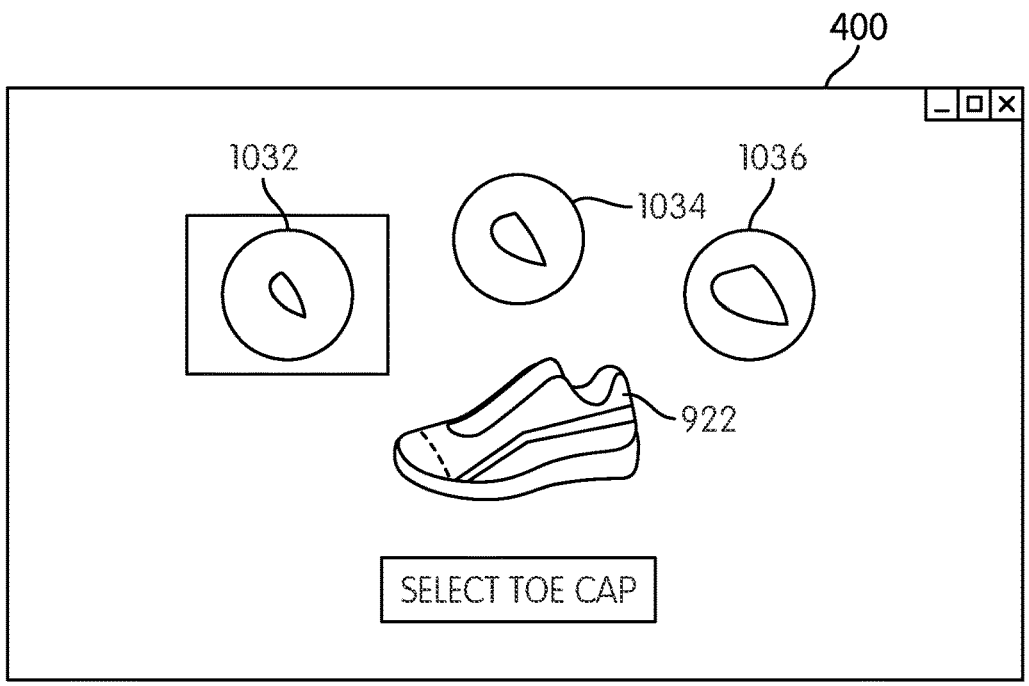
FIG. 13 is a schematic view of an embodiment where a user can select a toe cap for an article type.

FIGS. 11 through 13 illustrate various schematic views of article characteristics that can be varied, according to at least one embodiment. In some cases, upon selecting second upper 922 from article type set 901 (see FIG. 10), a user may have the option of independently varying various different article properties or characteristics. In some cases, a user may be have the option of selecting characteristics of the sole including, but not limited to: materials, density, weight, color, geometry as well as any other properties. For example, referring to FIG. 11, a user may have the option of selecting between a first sole material 1002, a second sole material 1004 and a third sole material 1006 for article type 922. For example, in the current embodiment, the user is selecting second sole material 1004 as the user selected article characteristic. In some cases, first sole material 1002, second sole material 1004 and third sole material 1006 may represent materials of increasing density. For example, in one embodiment, first material 1002 may be a soft foam material, second material 1004 may be a medium foam material and third material 1006 may be a hard foam material. However, in other cases, the materials could vary in any other manner. Moreover, it will be understood that in other cases, a user may select between similar materials that vary in size, shape and/or appearance. Still further, a user could select between soles having different types of cushioning, such as air bladders of varying pressures and/or other cushioning materials.

In some cases, a user may have the option to select different kinds of materials for an upper. For example, referring to FIG. 12, a user may select between first upper material 1020, second upper material 1022 and third upper material 1024. For example, in this case, the user may select third upper material 1024 as the user selected article characteristic. In some cases, first upper material 1020, second upper material 1022 and third upper material 1024 may correspond to upper materials with increasing mesh densities. In other cases, a user could select between uppers that vary in any other manner. In still other cases, a user could select between uppers of different sizes and/or shapes. In still other cases, a user could select between uppers of varying types of materials. For example, a user could select between uppers made of natural leather, synthetic leather, natural threads, synthetic threads, nylon, polyester, as well as other kinds of materials.

In some cases, a user may have the option to select between different kinds of supporting members. Examples of supporting members include, but are not limited to: toe caps, heel counters, heel cups, lacing systems, cushioning devices, straps as well as any other supporting members. Referring to FIG. 13, for example, a user may have the option of selecting between three different sizes for a toe cap, including first toe cap size 1032, second toe cap size 1034 and third toe cap size 1036. In the current embodiment, as an example, the user may select first toe cap size 1032 as the user selected article characteristic.

Although the current embodiments illustrate three possible options for various article characteristics, other embodiments could include any other number of options. For example, in other cases, a user may select between 2 or more options. In still other cases, a user may select between four or more options. In still other cases, a user may be presented with an approximately continuous range of options.

It will be understood that the presentation of options for article characteristics, such as sole material and/or upper material, may be in any arrangement and/or order. For example, some embodiments may show sole materials in order of increasing density. Likewise, some embodiments may show upper materials in order of decreasing mesh spacing. Still further, some embodiments may show toe caps in order of increasing length or size. However, in other embodiments these various different options could be presented to a user in any other arrangement.

In some embodiments, a system may automatically select a continuous or discrete range of options from which a user can select. For example, in some cases, upon selecting a sole from an article type, a system may automatically present the user with two or more options for varying sole characteristics. In other cases, however, a user may initially select two characteristic values (such as a low density foam and a high density foam), and the system may present a range of options between these values.

Figure 14:
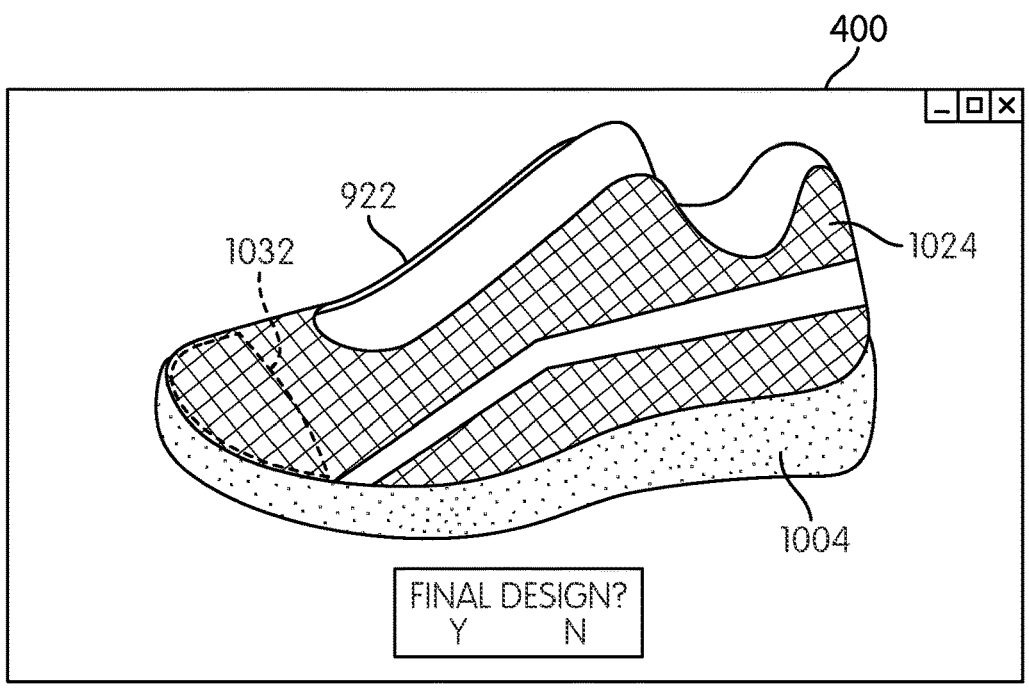
FIG. 14 is a schematic view of an embodiment where a user is shown a preview of a customized article type.

Generally, the range or set of article characteristics presented to a user can be restricted to avoid designs that are not structurally sound and/or that are difficult to manufacture. For example, referring back to FIG. 13, a system may only give the user options for toe cap sizes that are within the known dimensions for effective toe cap sizes. In other words, a user attempting to select a toe cap that extends back to the heel of an article may be prevented from selecting this option or otherwise informed that this particular toe cap size is not available. Likewise, in selecting upper mesh densities, as shown in FIG. 14, a user may be restricted from selecting mesh sizes that are outside the range of suitable mesh sizes for various types of footwear. This allows a system to help a user design articles with various characteristics that are within known design parameters.

A customization system can include provisions that allow a user to preview a customized article type prior to submitting the customized article type for manufacturing. Referring to FIG. 14, a user may be prompted with the option to finalize a design during a preview step of the customization process. During this step, the system may present a visual representation of the article including each of the user selected article characteristics. In still other cases, however, the preview process may occur simultaneously as various article characteristics are selected. For example, changes to the design can be implemented in real time as a user makes various changes to various article characteristics. In still other cases, a system may not provide any previews of the customized article.

In some cases, a graphical interface system includes provisions to allow a customer to submit a selected customized article type to a vendor. Generally, a graphical interface system may allow a customer to submit a selected customized article type in any manner. In some embodiments, a customer may manipulate a slider to create a customized article type and then submit the created customized article type by depressing a button or graphic within the graphical interface system. Referring back to FIG. 5, a customer may manipulate slider 515 to create a customized article type and then submit the customized article type by depressing submit button 599. In other embodiments, a customer may use a selection tool to submit a customized article type to a vendor. Referring to FIG. 9, in an alternative embodiment, a customer may manipulate selection tool 920 to submit a customized article type to a vendor. In this case, the customer submits fourth customized article type 954 to the vendor for manufacturing.

Figure 15:
FIG. 15 is an exemplary embodiment of a manufactured pair of footwear with a customized article type.

After a vendor receives a customized article type from a customer, the vendor manufactures a pair of footwear with the customized article type. FIG. 15 illustrates an exemplary embodiment of manufactured pair of footwear 1100 with fourth customized article type 954 as shown in FIG. 9. Once pair of footwear 1100 has been manufactured, it may be inspected for quality by the vendor. During this inspection, the manufactured pair of footwear 1100 may be compared to fourth customized article type 954 as shown in FIG. 9. Therefore, pair of footwear 1100 is not only inspected for structural integrity, but also for design accuracy. Finally, once pair of footwear 1100 has passed inspection, pair of footwear 1100 may be shipped to a pre-designated shipping address.

In some cases, a customer may create a customized article type with an intention that articles of footwear manufactured from that customized article type are relatively unique. Furthermore, the unique nature of an article of footwear manufactured from a customized article type may be a desirable feature of the process of creating a customized article type. In other words, a customer may engage in the process of creating a customized article type with a purpose to create a customized article type that is exclusive.

Generally, a customized article type may be exclusive if articles of footwear manufactured from the customized article type are not relatively common. In some embodiments, a customization system may implement a limit on the number of articles of footwear that may be manufactured from a customized article type. This may provide exclusivity to a customized article type.

Figure 16:
FIG. 16 is an exemplary embodiment of a portion of a database of customized article types with an associated number manufactured and a manufacture limit.

FIG. 16 illustrates an exemplary embodiment of a portion of database 1200 that may be internal to a vendor of a customization system. In this embodiment, database 1200 includes entries for customized article type 1201, times used 1202 and customized type limit 1203. In some embodiments, database 1200 may include additional and/or different attributes. For example, in some cases, database 1200 may include entries that determine if a customized article type has a customized type limit.

In some cases, customized article type 1201 may include entries for all customized article types created by a customization system. Furthermore, times used 1202 includes entries for the number of times an article of footwear of a particular customized article type has been manufactured. Finally, customized type limit 1203 may include a pre-determined limit for the number of times a customized article type may be manufactured. In some cases, the same pre-determined limit may be applied to all customized article types. In other cases, different pre-determined limits may be entered in customized type limit 1203 and associated with different customized article types.

In this exemplary embodiment, database 1200 includes three customized article types. In particular, database 1200 indicates that first customized article type 1211 has been used 221 times and has a limit of 250. Similarly, database 1200 includes second customized article type 1212 with times used 1202 entered as 300 and customized type limit 1203 listed as 500. Likewise, customized article type 1201 includes third customized article type 1213 with times used 1202 indicating 54 uses and customized type limit 1203 indicating 75.

In some cases, database 1200 may be associated with a graphical interface system in order to enforce exclusivity of customized article types. For example, a graphical interface system associated with a customization system may allow 29 more selections of first customized article type 1211 in order to limit the selection of first customized article type 1211 to 250 selections. With this configuration, database 1200 may support the exclusivity of customized article types.

Generally, a customization system may enforce exclusivity of customized article types in any manner. In some embodiments, a graphical interface system may not display a customized article type that has reached a pre-determined limit. In other embodiments, a graphical interface system may not permit the selection of a customized article type that has reached a pre-determined limit.

Figure 17:
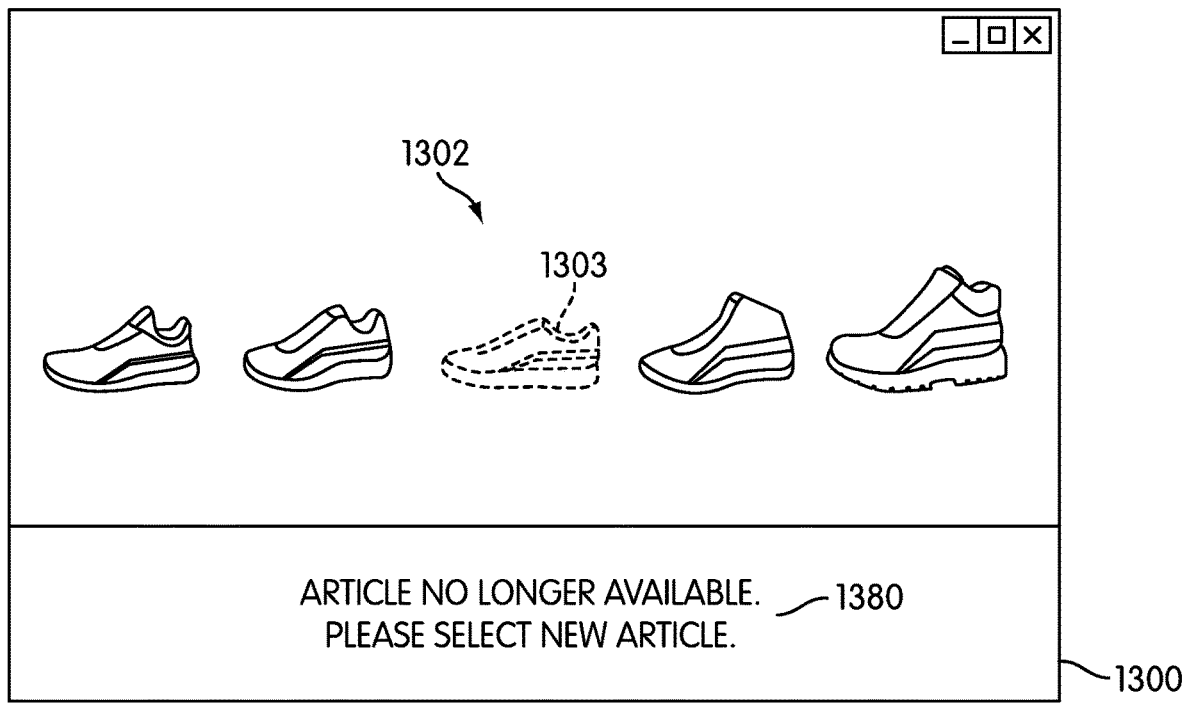
FIG. 17 is an exemplary embodiment of a graphical interface system displaying a customized article type that is no longer available.

FIG. 17 is an exemplary embodiment of graphical interface system 1300. Generally, graphical interface system 1300 may be substantially similar to the alternative embodiment of graphical interface system 400 in FIG. 9. In particular, graphical interface system 1300 may display second set of customized article types 1302 following the selection of a family of article types.

In this embodiment, second set of customized article types 1302 includes five customized article types. However, third customized article type 1303 is displayed in phantom by graphical interface system 1300. In addition, text 1380 displayed by graphical interface system 1300 indicates that third customized article type 1303 is no longer available. In some cases, graphical interface system 1300 displays third customized article type 1303 in phantom because a limit associated with third customized article type 1303 has been reached. Using this configuration, the exclusivity of third customized article type 1303 may be ensured.

Figure 18:
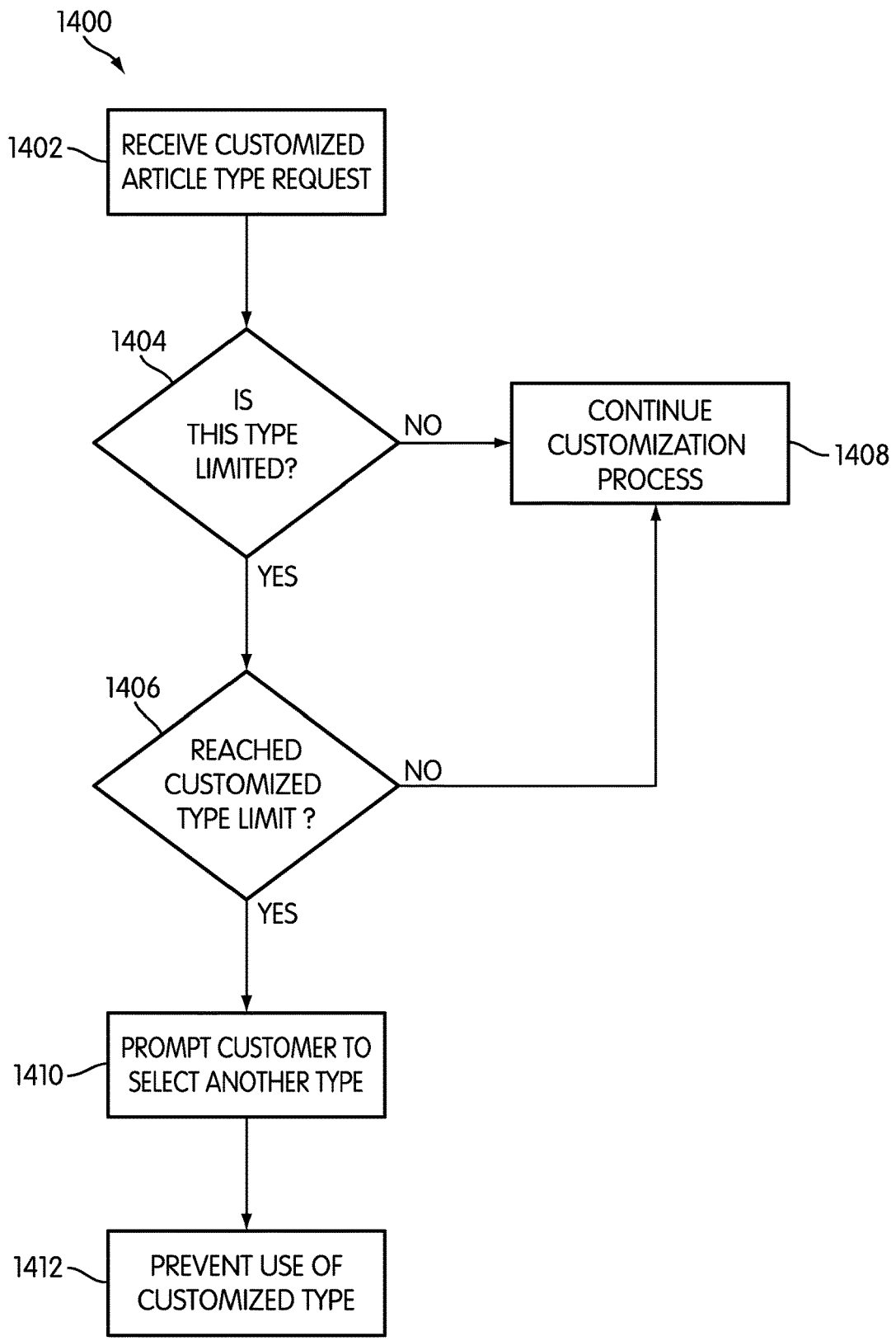
FIG. 18 is an embodiment of a process for ensuring exclusivity of customized article types.

FIG. 18 is an embodiment of process 1400 that may be executed to preserve exclusivity of customized article types. In some embodiments, process 1400 may be executed by customization system 101. In some cases, process 1400 may be executed by graphical interface system 1300.

During first step 1402, graphical interface system 1300 may receive a customized article type request. In some cases, this request may occur following the selection of a family of article types and prior to the display of a set of customized article types associated with the family of article types. In other cases, the customized article type request may be received when a customer manipulates a slider, for example, and indicates a graphical position that may be associated with the customized article type. In still other cases, the customized article type request may be received when a customer attempts to submit the customized article type for manufacture.

After receiving a customized article type request in first step 1402, graphical interface system 1300 determines if the customized article type is associated with a customized type limit during second step 1404. If the customized article type is not associated with a customized type limit, graphical interface system 1300 continues to fourth step 1408. During fourth step 1408, graphical interface system 1300 continues the customization process.

However, if graphical interface system 1300 determines that a customized article type is associated with a customized type limit during second step 1404, graphical interface system 1300 proceeds to third step 1406. During third step 1406, graphical interface system 1300 checks if the customized article type has reached the customized type limit. In some cases, graphical interface system 1300 may query a database such as database 1200 to ascertain the customized type limit for the requested customized article type. If the requested customized article type has not reached the customized type limit, graphical interface system 1300 proceeds to fourth step 1408 and continues the customization process.

If graphical interface system 1300 determines in third step 1406 that the customized article type has reached the customized type limit, graphical interface system 1300 prompts the customer to select another customized article type in fifth step 1410. Following fifth step 1410, graphical interface system 1300 prevents the use of the customized article type in sixth step 1412. With this process, the exclusivity of the customized article type may be ensured.

Figure 19:
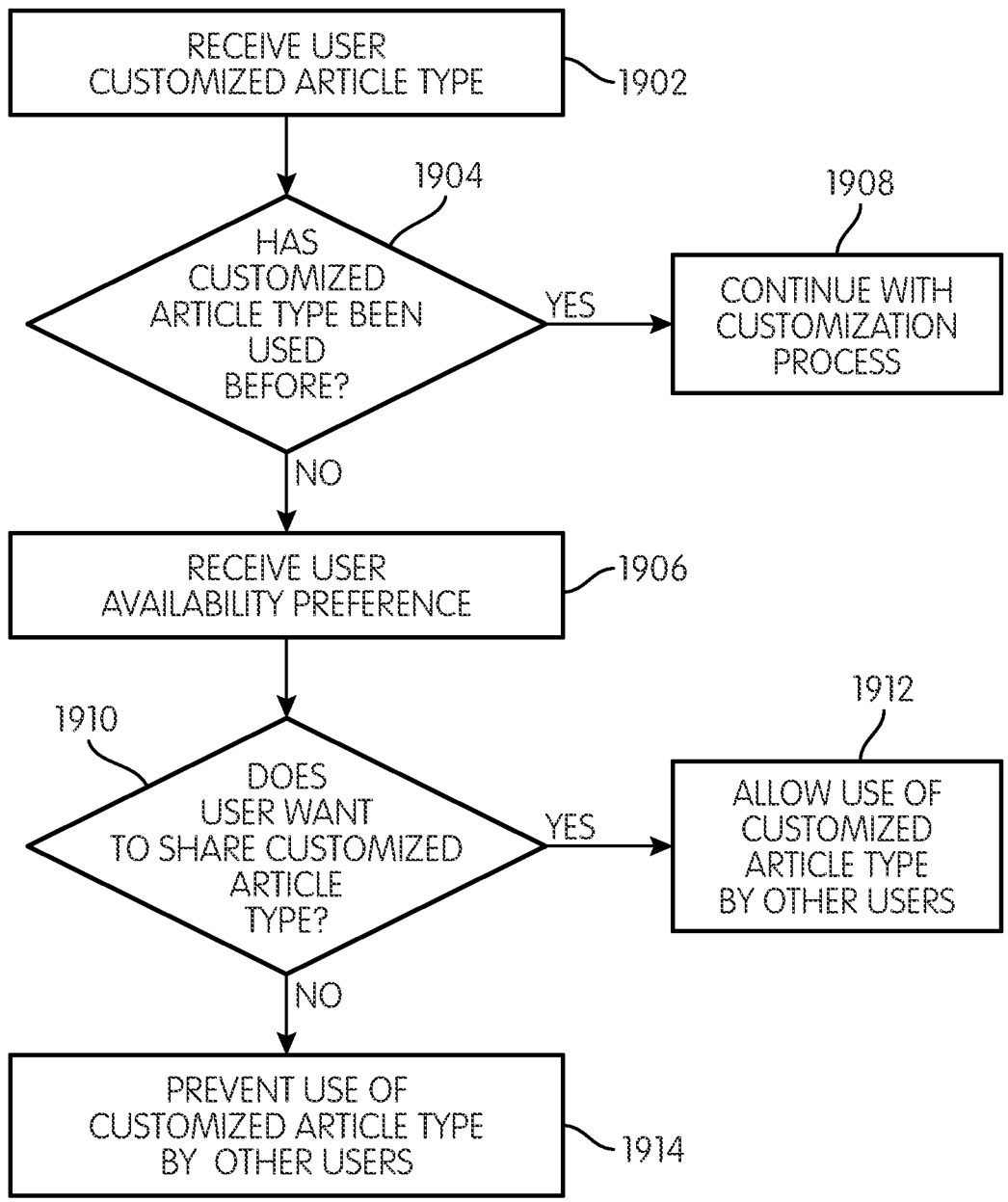
FIG. 19 is an embodiment of a process for allowing a user to determine if a customize article type may be shared with other users.

FIG. 19 illustrates an embodiment of a process for providing a user with article type sharing options. In some cases, some of the following steps could be performed by a graphical interface system. In other cases, some of the following steps could be performed by any other system, including any system associated with a proprietor. Moreover, in some cases, some steps may be performed by a graphical interface system while other steps could be performed by another system. It will be further understood that some of the following steps may be optional. In addition, the order of steps could vary in any manner in other embodiments.

In step 1902, a graphic interface system may receive a user customized article type. The customized article type may be created using any of the methods described above as well as any other known methods for making article types. Next, in step 1904, the graphical interface system determines if the customized article type has been used before. If the customized article type has been used before, the system continues to step 1908 where the customization process is continued. In this case, the user does not have the option to select sharing preferences since the article type is not unique to the user.

If, during step 1904, the graphic interface system determines that the customized article type has not been used before, the system may proceed to step 1906. In step 1906, the system may receive a user availability preference. In some cases, the system can prompt the user with a message such as "would you like to share this image?" In other cases, the availability preference could be retrieved from a user profile or other previously stored information.

Next, in step 1910, the graphical interface system may determine if the user wants to share the customized article type. This decision is based on the information received in step 1906. If the user has selected to share the customized article type, the graphical interface system may proceed to step 1912. In step 1912, the graphic interface system allows the customized article type to be used by other users or customers of the system.

If, during step 1910, the graphical interface system determines that the user does not want to share the customized article type, the system may proceed to step 1914. In step 1914, the graphical interface system may prevent other users from using the customized article type.

By allowing a user to share or not to share a customized article type, the user is able to control the exclusivity of the customized article type. This method allows users to create unique or truly "one of a kind" articles.

While various embodiments of the invention have been described, the description is intended to be exemplary rather than limiting and it will be apparent to those of ordinary skill in the art that many more embodiments and implementations are possible that are within the scope of the invention. Accordingly, the invention is not to be restricted except in light of the attached claims and their equivalents. Also, various modifications and changes may be made within the scope of the attached claims.

We claim:

1. A method of customization for an article of footwear, comprising:
    receiving a selected family of article types;
    providing a set of article types according to the selected family of article types, wherein information related to the set of article types is graphically representing the set of article types within a graphical interface system of a customization system;
    receiving a user-selected article type from the set of article types;
    determining whether the user-selected article type has reached a customized type limit; and
    manufacturing, if the user-selected article type has not reached the customized type limit, the article of footwear corresponding to the user-selected article type.

2. The method according to claim 1, further comprising:
    receiving a user availability preference related to the user-selected article type; and providing access to the user-selected article type based upon the user availability preference.

3. The method according to claim 1, wherein the information related to the set of article types is configured to be sent to a web browser.

4. The method according to claim 1, wherein the information related to the set of article types is configured to be sent to the graphical interface system running on a remote device.

5. The method according to claim 1, wherein the information related to the set of article types is configured to be sent to the graphical interface system running on a cell phone.

6. The method according to claim 1, wherein the selected family of article types have different insole geometries.

7. The method according to claim 1, wherein if the determining step determines that the user-selected article type has reached the customization type limit, the method further comprises prompting a user to select another article type.

8. A method of customization for an article of footwear, comprising:
  receiving, using a graphical interface system of a customization system, a selected family of article types;
  providing a set of article types according to the selected family of article types, wherein information related to the set of article types is graphically representing the set of article types within the graphical interface system of the customization system;
  receiving a user-selected article type from the set of article types;
  determining whether the user-selected article type has reached a customized type limit; and
  sending to a manufacturer, if the user-selected article type has not reached the customized type limit, information about the article of footwear corresponding to the user-selected article type.

9. The method according to claim 8, further comprising:
  receiving a user availability preference related to the user-selected article type; and
  providing access to the user-selected article type based upon the user availability preference.

10. The method according to claim 8, wherein the information related to the set of article types is configured to be sent to a web browser.

11. The method according to claim 8, wherein the information related to the set of article types is configured to be sent to the graphical interface system running on a remote device.

12. The method according to claim 8, wherein the information related to the set of article types is configured to be sent to the graphical interface system running on a cell phone.

13. The method according to claim 8, wherein the selected family of article types share a similar color scheme.

14. The method according to claim 8, wherein if the determining step determines that the user-selected article type has reached the customization type limit, the method further comprises prompting a user to select another article type.

15. A method of customization for an article of footwear, comprising:
  providing a set of article types, wherein information related to the set of article types is graphically representing the set of article types within a graphical interface system of a customization system;
  receiving, using the graphical interface system of the customization system, a user-selected article type from the set of article types;
  providing a group of variable article characteristics for the user-selected article type, each variable article characteristic in the group of variable article characteristics having a range of values;
  receiving information related to a user-selected article characteristic for at least one variable article characteristic in the group of variable article characteristics;
  determining whether the user-selected article characteristic has reached a customized type limit; and
  communicating to a manufacturer, the information related to the article of footwear corresponding to the user-selected article type.

16. The method according to claim 15, further comprising:
  receiving a user availability preference related to the user-selected article type; and
  providing access to the user-selected article type based upon the user availability preference.

17. The method according to claim 15, wherein the information related to the set of article types is configured to be sent to a web browser.

18. The method according to claim 15, wherein the information related to the set of article types is configured to be sent to the graphical interface system running on a remote device.

19. The method according to claim 15, wherein the information related to the set of article types is configured to be sent to the graphical interface system running on a cell phone.

20. The method according to claim 15, wherein the at least one variable article characteristic in the group of variable article characteristics is a height for a sole of the article of footwear.

* * * * *